United States Patent
Tsutsumi

(10) Patent No.: US 7,456,478 B2
(45) Date of Patent: Nov. 25, 2008

(54) MOS TRANSISTOR CIRCUIT

(75) Inventor: Masanori Tsutsumi, Souraku-gun (JP)

(73) Assignee: Panasonic Corporation, Osaka (JP)

( * ) Notice: Subject to any disclaimer, the term of this patent is extended or adjusted under 35 U.S.C. 154(b) by 204 days.

(21) Appl. No.: 11/270,664

(22) Filed: Nov. 10, 2005

(65) Prior Publication Data

US 2006/0097326 A1 May 11, 2006

(30) Foreign Application Priority Data

Nov. 10, 2004 (JP) ............................. P2004-326859

(51) Int. Cl.
 *H01L 23/62* (2006.01)
(52) U.S. Cl. ........................ 257/360; 257/350; 257/351; 257/358; 257/359; 257/E29.001
(58) Field of Classification Search ................. 257/350, 257/351, 358, 359, 360, E29.001
See application file for complete search history.

(56) References Cited

U.S. PATENT DOCUMENTS 5,742,307 A * 4/1998 Watrobski et al. ............. 347/62
2003/0223166 A1 12/2003 Chen et al.

FOREIGN PATENT DOCUMENTS

JP  2002-7500  1/2002

OTHER PUBLICATIONS

Chinese Office Action, with English translation, issued in Chinese Patent Application No. CN 2005101204168, mailed Dec. 28, 2007.

* cited by examiner

*Primary Examiner*—Evan Pert
*Assistant Examiner*—Tan N Tran
(74) *Attorney, Agent, or Firm*—McDermott Will & Emery LLP

(57) ABSTRACT

A reduction of a current capability of a MOS transistor (P1) is compensated by dynamically changing a substrate bias of the MOS transistor (P1) in response to a fluctuation of the power supply, and thus an operating speed is stabilized automatically. An NMOS transistor (N2) generates a current (I2) that changes in response to an extent of fluctuation of the power supply voltage, and then the current (I2) is converted into a voltage via a resistor (R3) to apply a forward bias to a substrate (back gate) of the MOS transistor (P1). When the current capability of the MOS transistor (P1) is reduced owing to a reduction of the power supply voltage, an adjustment is carried out automatically to lower a threshold voltage of the MOS transistor and thus the operating speed can be compensated.

1 Claim, 6 Drawing Sheets

MOS TRANSISTOR CIRCUIT

BACKGROUND OF THE INVENTION

1. Field of the Invention

The present invention relates to a MOS transistor circuit having an operating speed compensation function.

2. Description of the Related Art

In recent years, an importance of reduction in a signal delay caused due to the wiring resistance and the wiring capacitance of the signal line is rising, with the miniaturization and the higher integration of LSI. In particular, it is an important design theme that a variation of a delay time of the clock signal (clock skew) used to synchronize the internal operations over the whole LSI (referred simply to as a "clock" hereinafter) should be reduced.

As the technology to reduce the clock skew, there is the method of constituting a clock tree. The "clock tree" is a tree-like clock supply route built up by utilizing a clock repeater (repeater buffer), and is designed such that wiring lengths from a clock supply source to an end flip-flop, and the like are set equal respectively. In the prior art, as set forth in JP-A-2002-7500, a variation of a clock delay is minimized by making the loads driven by the clock buffer equal and devising a geometrical shape of the clock tree (i.e., by the layout design technology).

In recent years, with the progress of the high driving performance and the high integration of the digital circuit, a power consumed in the semiconductor integrated circuit is increased correspondingly. Thus, a "voltage drop of the power supply" due to the resistance of the power supply wiring and a "temperature rise of the substrate" due to the current flowing through the resistor becomes an issue. The "voltage drop of the power supply" is such a phenomenon that the voltage at a power-supply supply point of the transistor is lowered because the current flows through the power supply wiring.

As described above, even though the layout of the clock tree is properly designed, a difference arises in actual characteristics of the transistor elements due to the influence of the "voltage drop of the power supply" and the "temperature rise of the substrate", and thus in some cases a malfunction of the circuit is caused.

Then, explanation will be made concretely hereinafter. The power supply wirings have the resistance equivalently. For this reason, when a wiring length is prolonged, the resistance between the power supply voltage and the MOS transistor is increased proportionally, and thus the power supply potential supplied to the source of the PMOS transistor is reduced lower than the power supply potential (VDD) in design by the voltage drop by this resistance (IR-DROP). Also, a potential of the VSS wiring ground is lifted up by the voltage drop generated by the current flowing through the VSS wiring (ground) and an equivalent resistance of the VSS wiring, so that a potential supplied to the source of the NMOS transistor is increased higher than the VSS potential in design.

As a result of this, an operating speed of the MOS transistor circuit (the CMOS circuit) is lowered. That is, because the current flows through the power supply wiring, the voltage at the power-supply supply point of the transistor is lowered and also the operating speed of the transistor is lowered. Then, the voltage drop of the power supply is increased in the portion far from the power supply pad which is located on the outer periphery of the semiconductor integrated circuit, especially in the center portion of the semiconductor integrated circuit, while voltage drop of the power supply is decreased in the location that comes closer to the outer peripheral portion.

Therefore, such a problem arises that a level of the power supply voltage drop becomes different according to the position (location) in the semiconductor integrated circuit device and also the characteristic of the MOS transistor become different (is varied) according to the position in the semiconductor integrated circuit device.

Also, the "temperature rise of the substrate" is such a phenomenon that the temperature of the substrate is locally increased by the heat generated by circuit operations. When the power consumption becomes larger, a heating value becomes larger and then the substrate temperature around such circuit rises. That is, a local rise of the substrate temperature is affected depending on where the highly driven circuit is placed. Therefore, such a phenomenon occurs that the substrate temperature is different according to the position (location) in the LSI. In other words, the operating speed of the MOS transistor (in the case of the digital circuit, a switching speed) has dependence on the power supply voltage and the ambient temperature, and a current capability of the MOS transistor is lowered as the power supply voltage becomes lower and the temperature becomes higher. Since a reduction of the current capability of the MOS transistor means a reduction of the switching speed, consequently the delay of each MOS transistor becomes different in response to the circuit position in the semiconductor chip and the operating situation of the circuit.

Therefore, as set forth in JP-A-2002-7500, even when the route lengths of the clock supply routes are made equal by rendering the loads uniform or devising the geometrical shape of the circuit, a large clock skew is generated when an amount of delay is changed in a part of MOS transistors. That is, it is concluded that, under the conditions that the power supply voltage is not dropped and the temperature is kept constant, even when amounts of delay of respective clock routes are kept equal, if a drop of the power supply voltage or a local rise of the substrate temperature is caused, a difference is generated in the characteristics of individual MOS transistors on the semiconductor chip, amounts of delay in respective clock routes are varied, the clock skew is increased, and a malfunction of the LSI may be caused in the worst case. In the prior art, no countermeasure against the variation of the circuit characteristics caused due to the different level of the voltage drop of the power supply and the increase of the substrate temperature according to the position in the semiconductor integrated circuit device is taken.

SUMMARY OF THE INVENTION

It is an object of the present invention aims at stabilizing an operating speed of a MOS transistor irrespective of a fluctuation of a power supply voltage and a variation of a substrate temperature, suppressing a variation of an amount of delay of the MOS transistor, and eliminating a possibility of a malfunction of a circuit.

A MOS transistor circuit of the present invention provides a MOS transistor circuit used in a semiconductor integrated circuit, which includes a first conductivity type MOS semiconductor element; a resistor element inserted between a source of the first conductivity type MOS semiconductor element and a substrate of the first conductivity type MOS semiconductor element; and an adjusting portion for adjusting a magnitude of current flowing through the resistor element, in response to a voltage drop value in the source of the first conductivity type MOS semiconductor element.

Also, in the MOS transistor circuit of the present invention, one end of the resistor element is connected to a first voltage power supply, and the adjusting portion changes the magnitude of current flowing through the resistor element in response to a potential difference between the source of the first conductivity type MOS semiconductor element and the first voltage power supply.

Also, in the MOS transistor circuit of the present invention, the adjusting portion contains a second conductivity type MOS semiconductor element, a drain of the second conductivity type MOS semiconductor element is connected to the substrate of the first conductivity type MOS semiconductor element, a gate of the second conductivity type MOS semiconductor element is connected to a second voltage power supply, and a source of the second conductivity type MOS semiconductor element is connected to a common power supply.

Since the power supply lines of VDD, VSS have an equivalent resistance respectively, any voltage drop is generated steadily in the state the circuit is being operated, and an extent of the voltage drop is varied according to a distance from the power supply pad. The power supply voltage supplied to respective MOS transistors is reduced rather than a designed value in response to a level of the voltage drop, and also the operating speed is lowered. Here, a gate-source voltage of the second conductivity type MOS transistor constituting the adjusting portion in the MOS transistor circuit of the present invention is increased in response to the level of the voltage drop to supply a current (drain current) corresponding to the level of the voltage drop. This current is converted into a voltage via a resistor interposed between the drain of the second conductivity type MOS transistor and the power supply line, and thus a bias voltage corresponding to the level of the voltage drop is generated to apply the forward bias (bias in the forward direction) to the substrate (back gate) of the first conductivity type MOS transistor. When the forward bias is applied, the threshold value of the first conductivity type MOS transistor can be lowered, and thus the operating speed of the first conductivity type MOS transistor can be improved, so that a reduction of the operating speed due to a reduction of the power supply voltage can be automatically compensated. When the operating speed of the first conductivity type MOS transistor is also lowered due to the rise of the substrate temperature, the forward bias can be increased because the resistance value of the resistor interposed between the drain of the second conductivity type MOS transistor and the power supply line has a positive temperature coefficient (the character that the resistance value increases as the temperature rises), so that a reduction of the operating speed of the first conductivity type MOS transistor can be automatically compensated. As a result, the operating speed can be compensated automatically for both the voltage drop and the rise of the substrate temperature.

Also, a MOS transistor circuit of the present invention provides a MOS transistor circuit used in a semiconductor integrated circuit, which includes a first conductivity type first MOS semiconductor element; and a first conductivity type second MOS semiconductor element; wherein a source of the first conductivity type first MOS semiconductor element is connected to a first voltage power supply, a substrate of the first conductivity type first MOS semiconductor element is connected to a second voltage power supply via a resistor element, the substrate of the first conductivity type first MOS semiconductor element is connected to a drain of the first conductivity type second MOS semiconductor element, a gate of the first conductivity type second MOS semiconductor element is connected to the first voltage power supply, and a source of the first conductivity type second MOS semiconductor element is connected to a common power supply.

The forward bias corresponding to the level of the voltage drop or the rise of the substrate temperature is supplied to the back gate of the first conductivity type first MOS transistor as a constituent element of the CMOS circuit. Therefore, a reduction of the operating speed of the MOS transistor can be compensated automatically.

Also, a semiconductor integrated circuit of the present invention provides a semiconductor integrated circuit utilizing the MOS transistor circuit of the present invention, wherein the MOS transistor circuit is used in a clock line.

Accordingly, the variation of an amount of delay in the clock repeater caused due to a drop of the power supply voltage or a rise of the substrate temperature can be compensated, and generation of a large clock skew can be suppressed. Therefore, a possibility of a malfunction of the circuit can be eliminated.

According to the present invention, since the forward bias responding to the level of the voltage drop is generated by changing the magnitude of current flowing through the resistor element in response to the level of the voltage drop in the power supply line, the substrate bias (back gate bias) of the MOS transistor can be adjusted appropriately. Therefore, the change of the operating speed of the MOS transistor caused due to the drop of the power supply voltage can be compensated automatically (i.e., without adjustment).

Also, even when the local rise of the substrate temperature is generated, the resistance value of the resistor element is increased following upon the temperature rise, and thus the forward bias is changed. Therefore, the substrate bias (back gate bias) of the MOS transistor can be appropriately adjusted in response to an extent of the temperature rise. As a result, the change of the operating speed of the MOS transistor caused by the temperature rise of the substrate can also be compensated automatically (i.e., without adjustment).

Also, if this MOS transistor circuit is used in the clock line, generation of a large clock skew can be suppressed and also a malfunction of the circuit can be prevented.

DESCRIPTION OF THE PREFERRED EMBODIMENTS

First, a substrate bias effect will be explained hereunder. A threshold value Vth (Vb) of the MOS transistor derived when the substrate bias effect is considered is given by following Eq.(1).

$$Vth(Vb)=Vt-\Delta Vt(Vb) \qquad (1)$$

where Vb is a substrate potential on the basis of a source (i.e., substrate bias), Vt is a threshold voltage of the MOS transistor when a substrate bias is zero, and $\Delta Vt(Vb)$ is a level of change of the threshold voltage by the substrate bias effect.

This $\Delta Vt(Vb)$ is given by a following Eq.(2).

$$\Delta Vt(Vb)=K\{(2\phi-Vb)1/2-(2\phi)1/2\}$$

(in the case of the P-type MOS transistor)

$$\Delta Vt(Vb)=K\{(2\phi+Vb)1/2-(2\phi)1/2\} \qquad (2)$$

(in the case of the N-type MOS transistor)

where K is an integer of about 0.3 to 2. Also, $\phi=(kT/q)\cdot\ln(N/ni)$ (K is a Noltzmann's constant, T is an absolute temperature, q is an electronic charge, N is an impurity concentration of the substrate, and ni is an intrinsic carrier node).

As apparent from Eq(1), the threshold voltage of the MOS transistor is changed by the substrate bias. Also, it is understood from Eq.(2) that a level of change of the threshold voltage caused by the substrate bias can be controlled appropriately by adjusting the voltage value of the substrate bias.

Therefore, in the present invention, the switching speed of the MOS transistor is stabilized by utilizing positively this substrate bias effect. That is, when the current capability of the MOS transistor is lowered by the reduction of the power supply voltage or the local rise of the substrate temperature, the substrate bias (back gate bias) is automatically adjusted in response to the extent of reduction in the direction to compensate the current capability of the MOS transistor. As a result, the operating speed of the MOS transistor is automatically compensated.

First Embodiment

Embodiments of the present invention will be explained concretely with reference to the drawings hereinafter.

Figure 1:
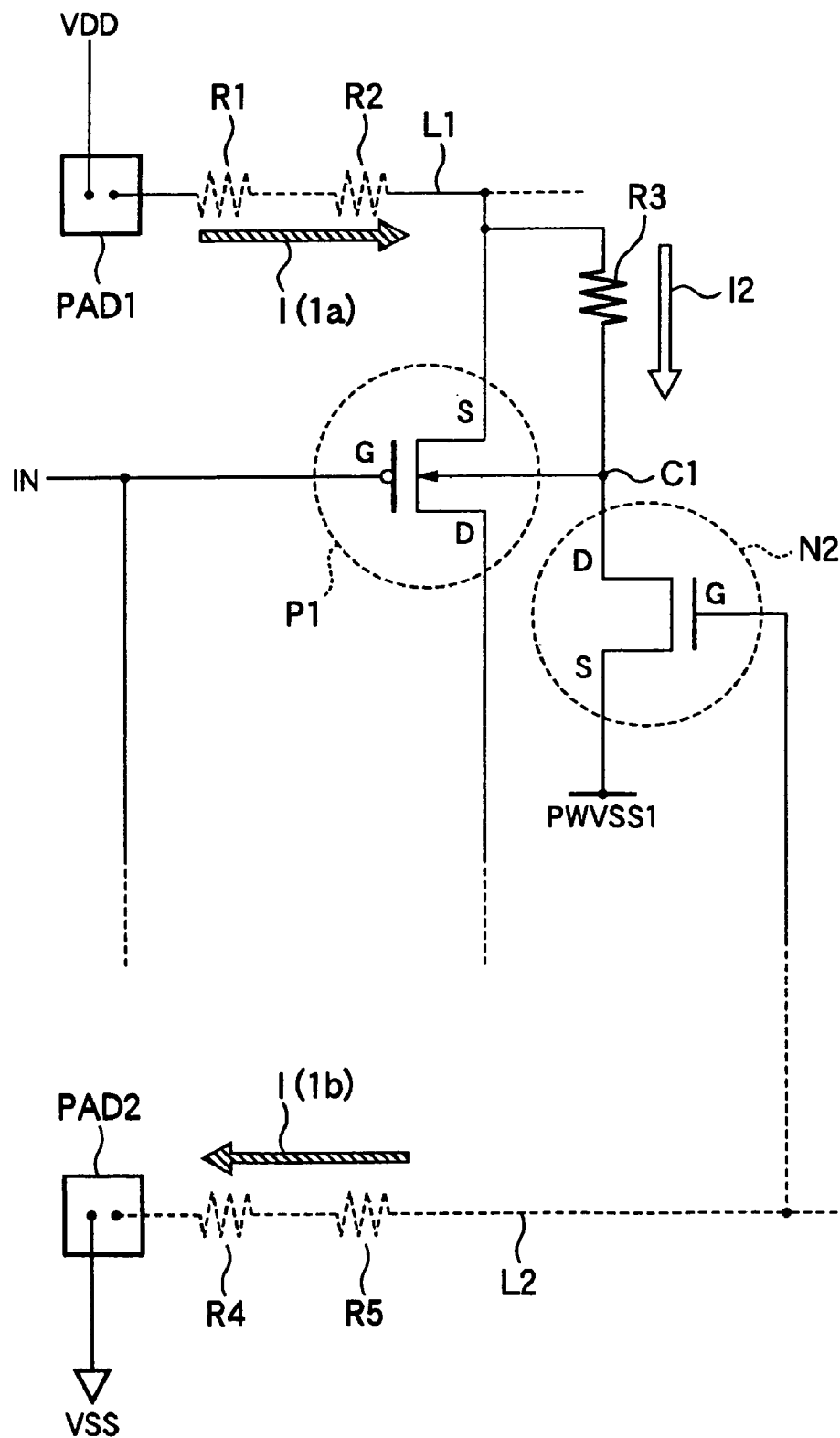
FIG. 1 is a circuit diagram showing a configuration of an example of a MOS transistor circuit (an example of an operation compensation applied to a PMOS transistor) of the present invention.

FIG. 1 is a circuit diagram showing a configuration of an example of a MOS transistor circuit (an example of an operation compensation applied to a PMOS transistor) of the present invention. In FIG. 1, a small round dot is affixed to a gate of the PMOS transistor to discriminate from the NMOS transistor.

A circuit in FIG. 1 shows a portion of a PMOS transistor (P1) extracted as an constituent element of the CMOS circuit (complementarily-connected MOS transistor circuit: which is used basically by connecting both gates of the P-type MOS transistor and the N-type MOS transistor in common, and used to construct a circuit, e.g., a logic gate such as NAND, NOR, or the like, a decoder of a memory, or the like in addition to the inverter).

In FIG. 1, VDD, VSS denote a power supply voltage on the high level side and a power supply voltage on the low level side respectively, and these power supply voltage are supplied from power supply pads (PAD1, PAD2). Also, a power supply line (L1) on the high level side and a power supply line (L2) on the low level side have equivalent resistances (R1, R2, R4, R5, and the like). Therefore, any current flows steadily through the power supply lines (L1, L2) in an operative state of the semiconductor integrated circuit to generate the voltage drop. When the power supply voltage is lowered, the operating speed of the PMOS transistor (P1) is lowered. Also, since the resistance values of the power supply lines (L1, L2) are different dependent on distances from the power supply pads (PAD1, PAD2), a deviation is generated in the actual power supply voltage in answer to the layout position of the MOS transistor.

Therefore, in the circuit in FIG. 1, in order to compensate appropriately the operating speed of each MOS transistor in response to a level of voltage drop of each MOS transistor, a substrate bias circuit consisting of a resistor (R3) and an NMOS transistor (N2) is provided. A source (S) of the NMOS transistor (N2) constituting this substrate bias circuit is connected to a common power supply voltage (PWVSS1) on the low level side, which is stabilized and whose level variation is small, a drain (D) is connected to a substrate (back gate) of the PMOS transistor (P1), and a gate (G) is connected to the power supply line (L2) of a power supply (VSS) on the low level side. The stabilized common power supply voltage (PWVSS1) is VSS (the power supply voltage on the low level side) that is designed to suppress a fluctuation of the voltage. This common power supply voltage (PWVSS1) functions as a reference voltage that serves as reference to sense a fluctuation of the power supply voltage.

Also, the resistor (R3) is connected between the power supply wiring (L1) of the power supply (VDD) on the high level side and a common connection point (C1) located between the drain of the NMOS transistor (N2) and the back gate of the PMOS transistor (P1). In the circuit in FIG. 1, a current I2 whose current magnitude is changed in response to a level of voltage drop on the power supply line L1 of the power supply VDD on the high level side (and the power supply line L2 of the power supply VSS on the low level side) is generated, and then the forward bias is generated by converting the current I2 into the voltage via the resistor R3, so that a potential of the back gate (potential at the point C1) of the PMOS transistor (P1) can be dynamically changed. Accordingly, a current capability of the P-channel MOS transistor (P1) can be automatically adjusted, and thus a reduction of the operating speed of the PMOS transistor (P1) can be prevented.

Then, a circuit operation will be explained concretely hereunder. In case the voltage drop is not generated (ideal state), no fluctuation is generated the power supply voltages (VDD, VSS), and then potentials of the gate (G) and the source (S) of the NMOS transistor (N2) become equal. Thus, the NMOS transistor (N2) is turned off. In this state, no current flows through the resistance R3 (i.e., I2=0 in FIG. 1), and therefore the source (S) of the PMOS transistor (P1) is equal in potential to the substrate (back gate). However, actually any currents (I1(a), I1(b)) is flowing steadily through the power supply lines L1, L2 when the semiconductor integrated circuit is being operated, and thus the voltage drop is generated by resistances (R1, R2, R4, R5, etc.).

As described above, a level of this voltage drop is different in response to a distance from the power supply pads (PAD1, PAD2). Here, in case the current (I(1a)) flows through the power supply line (L1) on the high level side and the voltage drop is generated by the resistors (R1, R2, and the like), an almost equal magnitude of current (I(1b)) also flows through the power supply line (L2) on the low level side. The equivalent voltage drop is generated by the equivalent resistances (R1, R2, and the like) having the same resistance value.

Therefore, the actual potential of the gate (G) of the NMOS transistor (N2) is increased rather than the low level side power supply voltage VSS (design value). Thus, a gate-source voltage (Vgs) is generated, and then the NMOS transistor (N2) is turned on to supply the current (I2) when such voltage exceeds a threshold value. Accordingly, a potential difference is generated across the resistor (R3) to generate a forward bias (the substrate bias in the forward direction). When the voltage drop generated in the power supply lines (L1, L2) is increased larger, a magnitude of the current (I2) is increased to increase the forward bias. When the forward bias is applied, the substrate potential (back gate potential) of the PMOS transistor (P1) is lowered, and the threshold value is lowered. Thus, the current capability of the PMOS transistor can be improved, and also a reduction of the operating speed can be suppressed.

Also, even when the substrate temperature (ambient temperature) is increased locally, the compensation of the reduction in the operating speed can be executed in the MOS transistor circuit in FIG. 1. That is, the case where the current capability of the PMOS transistor (P1) is lowered by the local rise of the substrate temperature is assumed. At this time, since the resistance (R3) has a positive temperature coefficient, the resistance value is increased with the temperature rise. Therefore, because the current I2 flows, the voltage drop across the resistor (R3) is increased. As a result, the potential of the substrate (back gate) of the PMOS transistor (P1) is lowered much more, the threshold value of the PMOS transistor (P1) is lowered, and a reduction of the switching speed of the PMOS transistor (P1) can be compensated.

In this manner, in the circuit in FIG. 1, the forward bias is changed in response to an actual level of the voltage drop generated in the power supply lines (L1, L2) or a rise of the substrate temperature, and thus the substrate potential (back gate potential) can be dynamically adjusted. As a result, a reduction of the current capability of the PMOS transistor (P1) can be compensated appropriately. Therefore, a reduction of the operating speed of the PMOS transistor due to both the drop of the power supply voltage and the temperature rise of the substrate can be automatically compensated. In the above explanation, explanation is made of the PMOS transistor (P1) as an example, but the same is true of the NMOS transistor.

Figure 2:
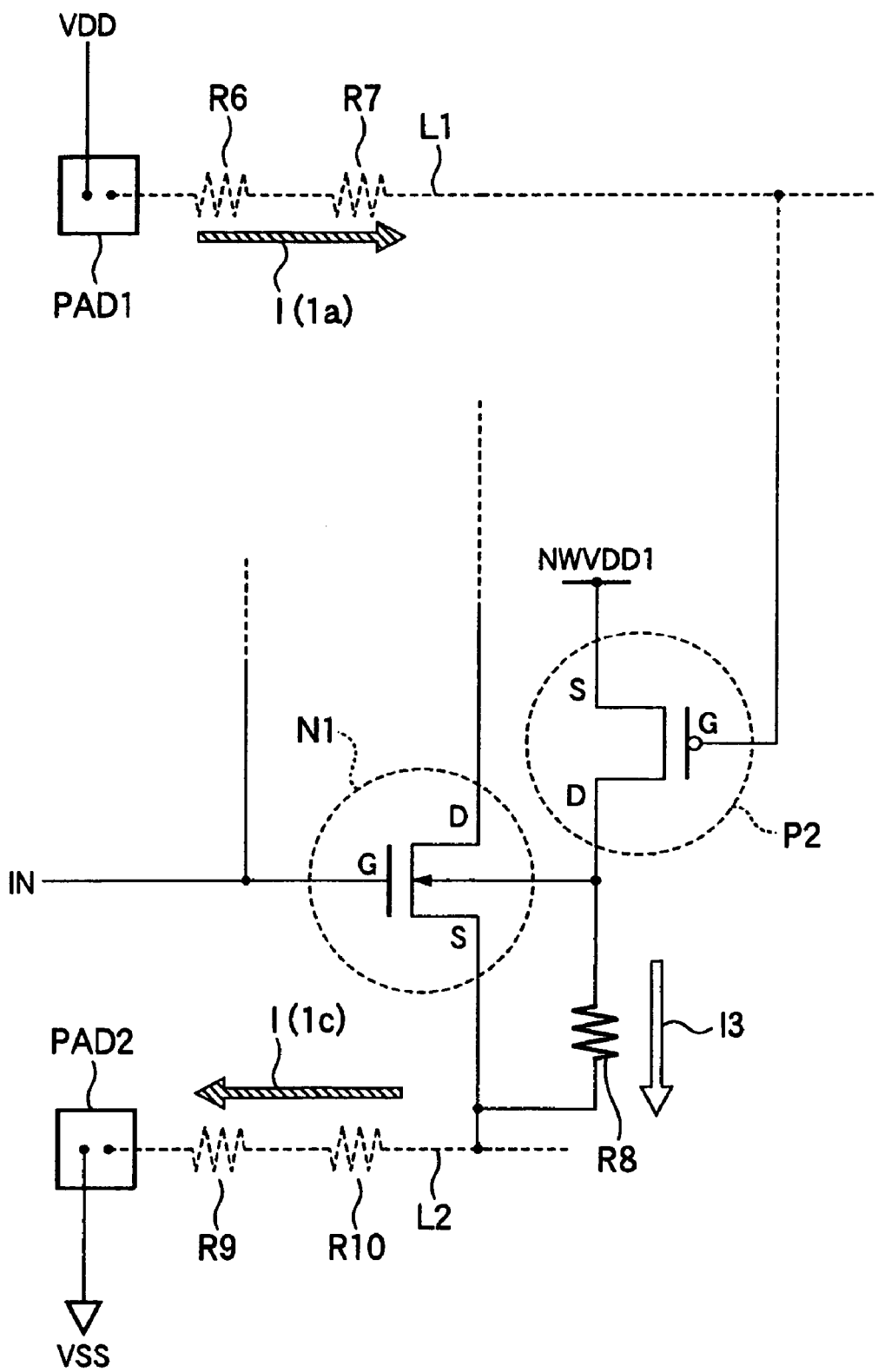
FIG. 2 is a circuit diagram showing a configuration of another example of a MOS transistor circuit (an example of an operation compensation applied to an NMOS transistor) of the present invention.

FIG. 2 is a circuit diagram showing a configuration of another example of the MOS transistor circuit of the present invention. In FIG. 2, a portion of an NMOS transistor (N1) as a constituent element of the CMOS circuit is extracted and shown. An operation of the circuit in FIG. 2 is similar to that in FIG. 1. More particularly, a current I(1(c)) flows through the power supply line (L2), the voltage drop is generated by resistances (R9, R10, etc.), a gate-source voltage (Vgs) of the NMOS transistor (N1) is reduced, and the operating speed is lowered.

In contrast, a gate potential of a PMOS transistor (P2) is lowered by the voltage drop generated by equivalent resistances (R6, R7) and a current I(1(d)) on the power supply line (L1), and thus the gate-source voltage (Vgs) is increased. Then, the PMOS transistor (P2) is turned on, a current (I3) flows to generate the forward bias, a threshold value of the NMOS transistor (N1) is lowered, the current capability is improved, and a reduction of the operating speed can be compensated.

Figure 3:
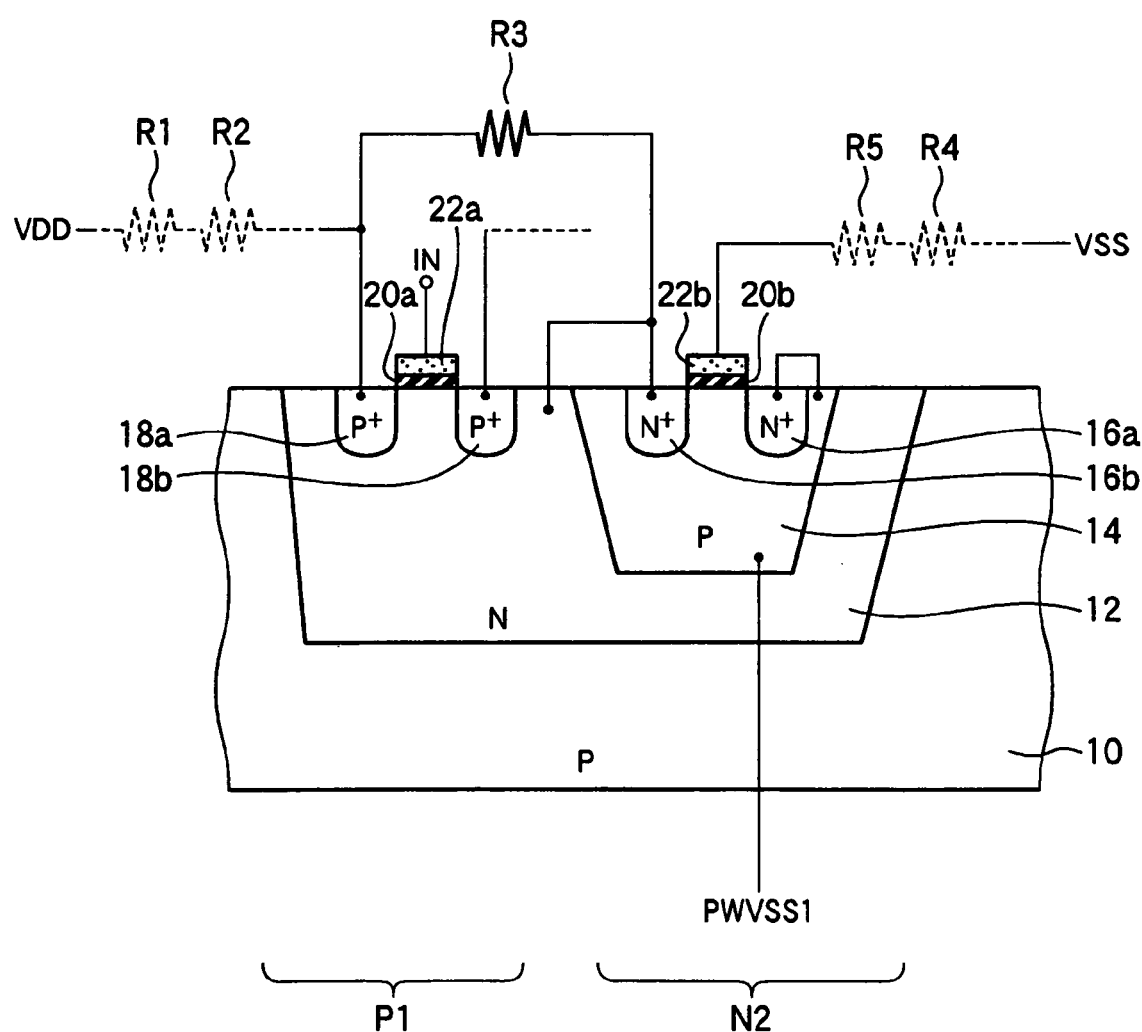
FIG. 3 is a sectional view showing an example of a device sectional structure in an LSI in which the circuit in FIG.1 is integrated.

FIG. 3 is a sectional view showing an example of a device sectional structure in an LSI in which the MOS transistor circuit in FIG. 1 is integrated. A free control of the back gate bias of the PMOS transistor (P1) can be carried out by using a double well structure, as shown in FIG. 3.

In FIG. 3, an N-well 12 is formed in a P-type substrate 10, and a P-well 14 is further formed in the N-well 12.

A source layer (18a) and a drain layer (18b) of the PMOS transistor (P1) are formed in the N-well 12. Also, a gate electrode 22a is formed via a gate oxide film 20a. A source layer (16a) and a drain layer (16b) of the NMOS transistor (N1) are formed in the P-well 14. Also, a gate electrode 22b is formed via a gate oxide film 20b.

The common power supply voltage (PWVSS1), which acts as a reference to sense a fluctuation of the power supply voltage (VDD) and which has a small level variation, is the low level power supply voltage (VSS) that is separated from circuit operations of the switching transistor, and the like and connected only to the P wells (14, etc.).

In the above example, the bias system of the type in which the substrate bias is zero when the voltage drop does not exist and the substrate bias is changed in response to a level of voltage drop when the voltage drop occurs is employed. However, the present invention is not limited to this. The continuous bias system may be employed. That is, a constant substrate bias is applied from the beginning, and then the operation compensation of the MOS transistor can be carried out by decreasing the substrate bias in response to the power supply voltage variation or the substrate temperature rise.

Figure 6:
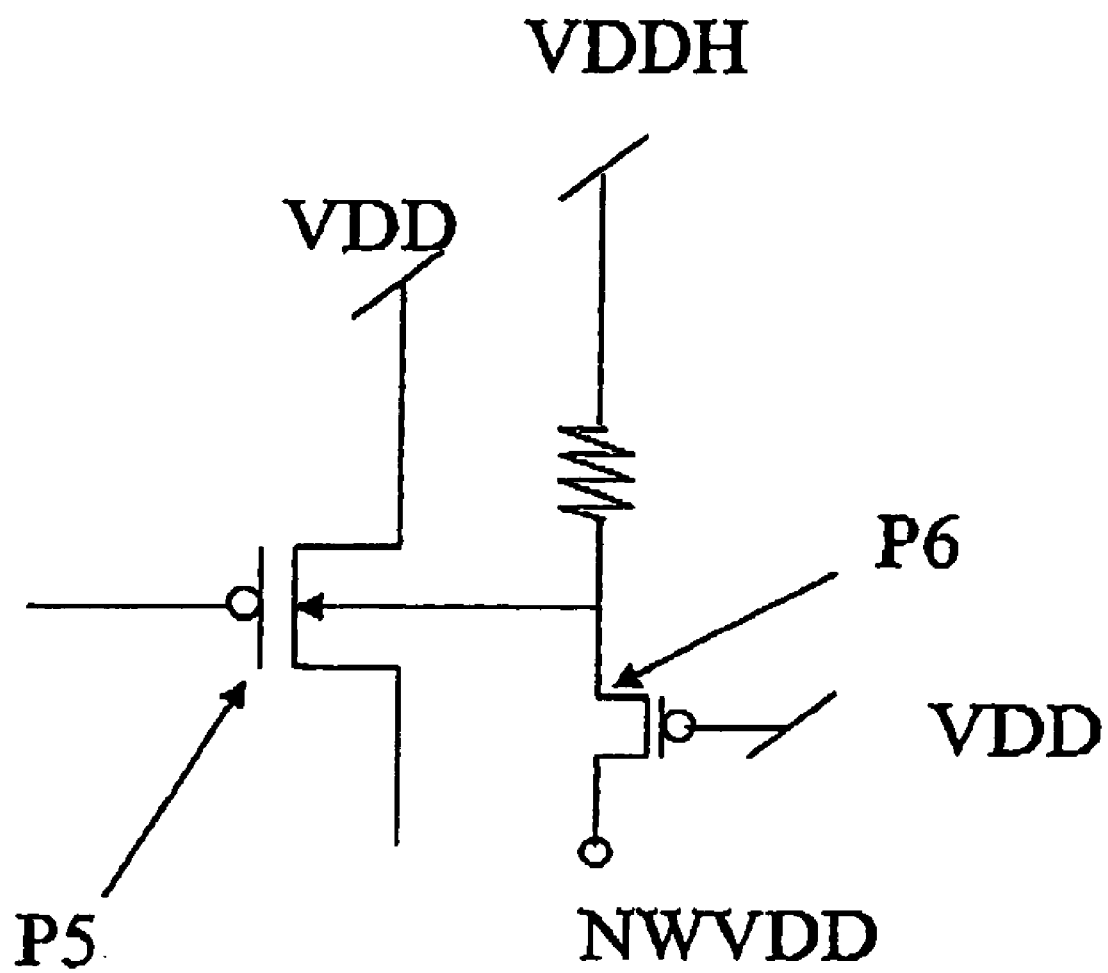
FIG. 6 is a circuit diagram showing a configuration of another example of a MOS transistor circuit.

For example, in FIG. 6, a power supply (VDD) is mutually connected to a source of PMOS transistor (P5) and a gate of PMOS transistor (P6), a source of the PMOS transistor (P6) is connected to a power supply (VDDH) having higher voltage than the power source (VDD) via a resistance, a drain of the PMOS transistor (P6) is connected to a common power supply NWVDD having low level fluctuation. That is, in a situation that PMOS transistor (P6) is OFF, the VDDH is applied to a substrate of the PMOS transistor (P5) as a back bias. At this time, when the voltage drop is occurred, since the power supply (VDD) comes down than the NWVDD, the PMOS transistor (P6) is tuned to ON status, a current is flowed to the resistance. And, a substrate bias applied to a substrate of the PMOS transistor (P5) become small because of the voltage drop caused by flowing the current to the resistance, the operating speed of the PMOS transistor (P5) can be compensated. Because the voltage drop become bigger and the current flowed in the resistance become bigger, the value of the substrate bias also become small, operation compensation can be carried out in response to the power supply voltage variation or the substrate temperature rise.

Second Embodiment

Figure 4:
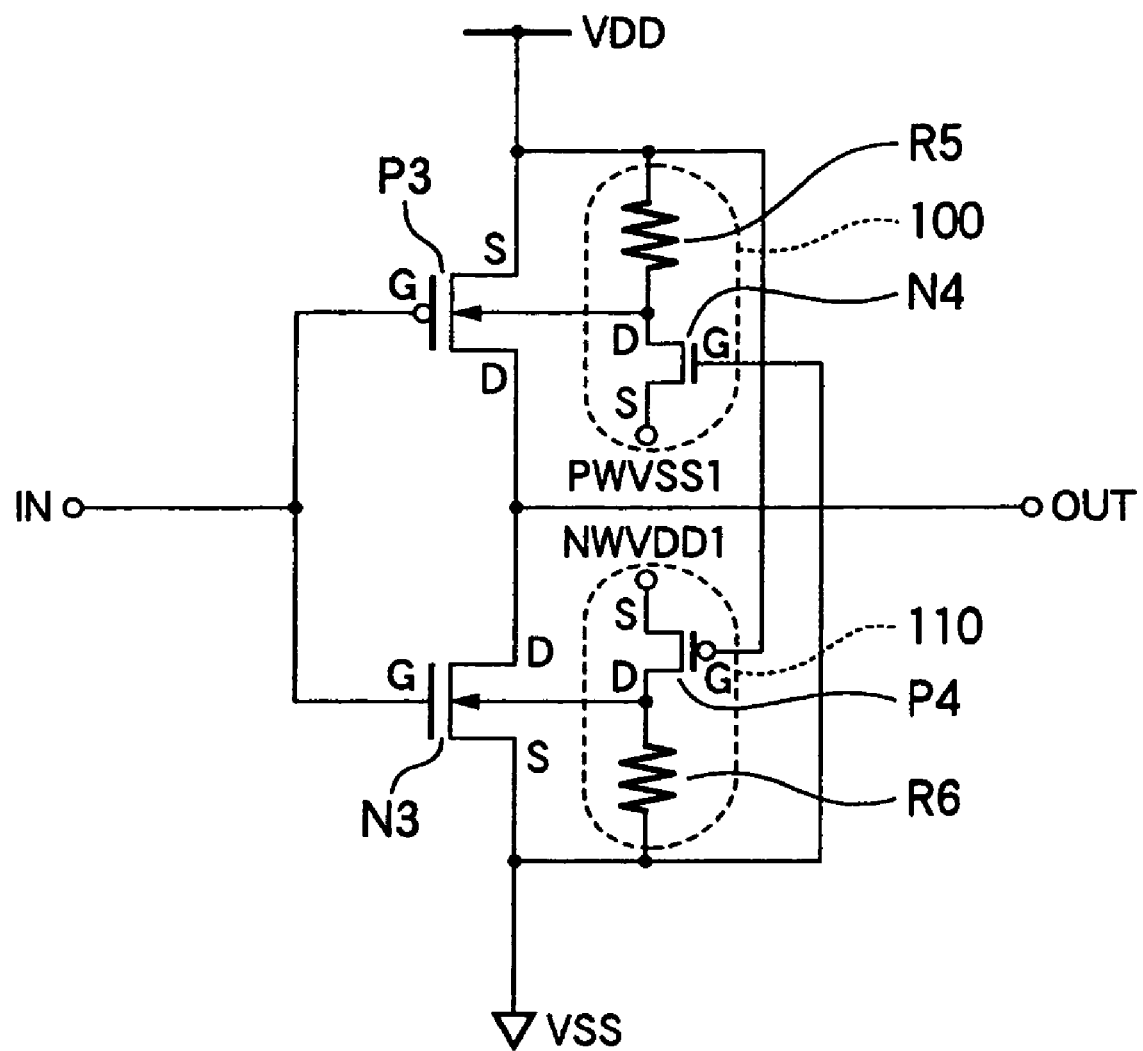
FIG. 4 is a circuit diagram showing a configuration of a CMOS inverter circuit built up by using the MOS transistor circuits of the present invention.

FIG. 4 is a circuit diagram showing a configuration of a CMOS inverter circuit built up by using the MOS transistor circuits of the present invention. The CMOS inverter circuit in FIG. 4 is constructed by combining respective MOS transistor circuits shown in FIG. 1 and FIG. 2. More particularly, the CMOS inverter circuit in FIG. 4 is constructed by a PMOS transistor (P3) to a gate of which an input signal (IN) is given, an NMOS transistor (N4) and a resistor (R5) used to apply an adaptive substrate bias control, an NMOS transistor (N3) to a gate of which the input signal (IN) is given, and a PMOS transistor (P4) and a resistor (R6) used to apply the adaptive substrate bias control. Here, the NMOS transistor (N4) and the resistor (R5) constitutes a substrate bias circuit 100, and the PMOS transistor (P4) and the resistor (R6) constitute a substrate bias circuit 110.

In the above embodiment, according to the operations explained with reference to FIG. 1 and FIG. 2, the substrate potential (back gate bias) is dynamically controlled in response to the fluctuation of the power supply voltage level due to the voltage drop (or the local variation of the substrate temperature). Therefore, when the power supply voltage is changed, the operating speed of the PMOS transistor (P3) and the NMOS transistor (N3) can be stabilized. As a result, a delay time generated from a time point when a level of the input signal (IN) of the CMOS inverter is changed from VSS to VDD/2 to a time point when a level of an output signal (OUT) is changed from VSS or VDD to VDD/2 can be kept constant.

Third Embodiment

Figure 5:
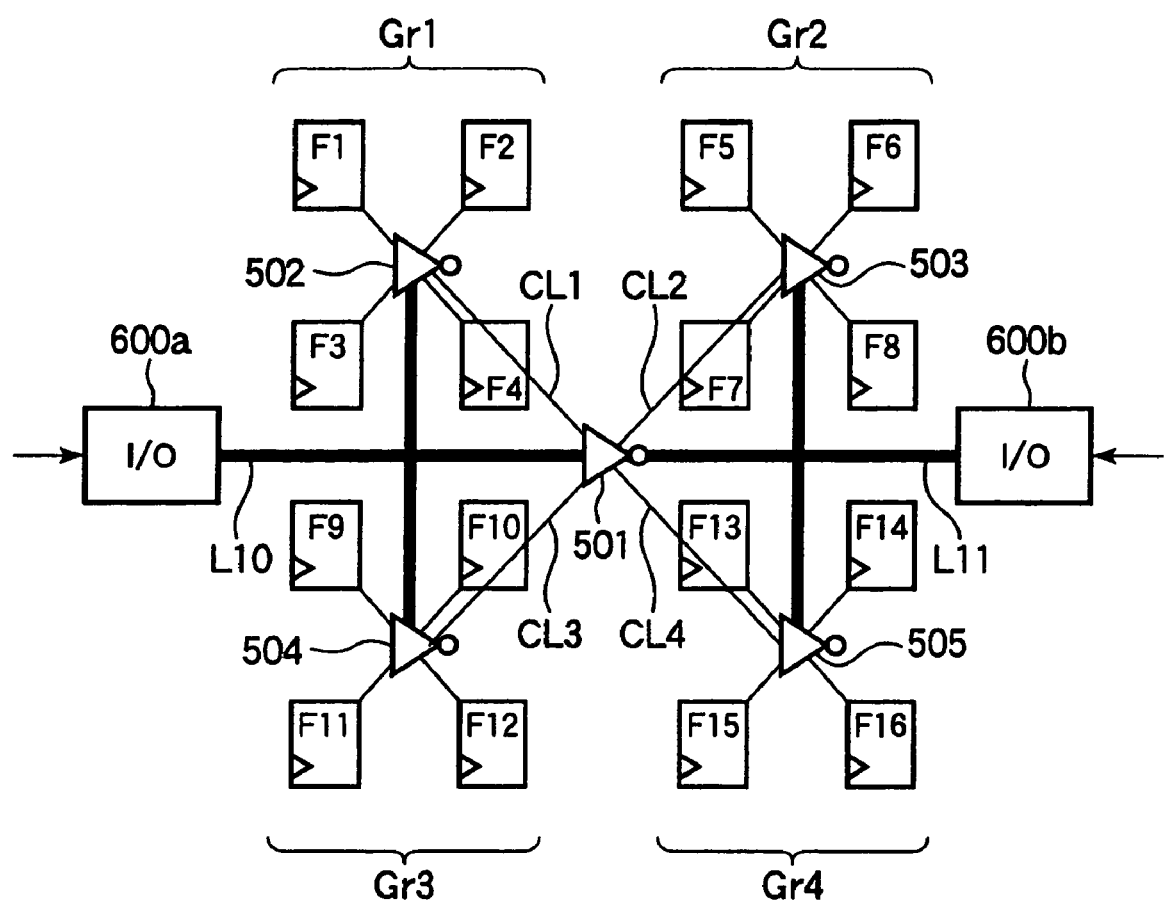
FIG. 5 is a view showing a configuration of a clock tree using the CMOS inverter circuit of the present invention as a clock repeater.

FIG. 5 is a view showing a configuration of a clock tree using the CMOS inverter circuit having the operating speed compensation function of the present invention as a clock repeater. The clock tree is used to reduce the clock skew in the large scale ASIC, or the like. The clock tree is a tree-like clock supply route built up by utilizing the clock repeater (repeater buffer), and is designed to make the wiring lengths from the clock supply source to the end flip-flops, etc. equal. A variation of clock delay is minimized by making the loads driven by the clock buffer uniform or devising the geometrical shape of the clock tree. In the clock tree in FIG. 5, a variation of the signal delay is suppressed from a viewpoint of circuit by using the CMOS inverter circuit having the operating speed compensation function of the present invention as the clock repeater (clock buffer) in addition to the devising of the layout design.

In FIG. 5, a large number of flip-flops (FF1 to FF16) are divided into four groups (Gr1 to Gr4) and placed on the semiconductor chip. The group Gr1 is composed of four flip-flops (FF1 to FF4), and driven by a clock buffer 502 respectively. Similarly, the group Gr2 is composed of four flip-flops (FF5 to FF8), and driven by a clock buffer 503 respectively. The group Gr3 is composed of four flip-flops (FF9 to FF12), and driven by a clock buffer 504 respectively. The group Gr4 is composed of four flip-flops (FF13 to FF16), and driven by a clock buffer 505 respectively.

An operation clock is supplied from a clock buffer 501 placed in the center to the clock buffers 502, 503, 504, 505 via clock supply lines CL1, CL2, CL3, CL4 respectively. The CMOS inverter circuit having the operating speed compensation function of the present invention, which has the configuration shown in FIG. 4, is used as the clock buffers 501 to 505 respectively.

Accordingly, even though different fluctuation of the power supply voltage or different change of the substrate temperature is generated every buffer of the clock buffers (501 to 505), the adaptive substrate bias control is applied every clock buffer and thus the characteristic (operating speed) of each clock buffer is always stabilized. Therefore, the large clock skew is never generated. A large number of flip-flops (FF1 to FF16) can be driven at the same timing.

In FIG. 5, lines L10, L11 indicated by a thick line are a common power supply wiring used to supply the common power supply voltages (PWVSS1 and NWVSS1), whose level fluctuation is small and which is stabilized, to the clock buffers 501 to 505 respectively. The common power supply voltages (PWVSS1 and NWVSS1) are supplied from I/O circuits 600a, 600b.

In this manner, the countermeasure against the fluctuation of the power supply voltage and the rise of the substrate temperature attendant upon the circuit operation, which becomes the issue in the high drive performance and the high integration degree logic circuit, is taken in the clock tree in FIG. 5 from the aspect of the circuit technology. Therefore, such clock tree can drive simultaneously the flip-flops at an exact timing.

As explained above, according to the MOS transistor circuit of the present invention, the current that changes in response to the fluctuation of the power supply voltage is generated and then the substrate bias is changed based on the current. Therefore, the change of the current capability of the MOS transistor due to the fluctuation of the power supply voltage can be compensated and also the operating speed can be stabilized automatically (i.e., without adjustment). Also, the substrate bias can be changed in answer to the variation of the ambient temperature by utilizing positively the temperature characteristic of the resistance value of the resistor that is used to generate the substrate bias (i.e., the positive temperature coefficient). Therefore, the operation of the MOS transistor can be compensated for not only the fluctuation of the power supply voltage but also the local rise of the substrate temperature.

Also, whichever system is selected from the forward bias system and the continuous bias system, basically the circuit used to apply the adaptive substrate bias control can be built up by one MOS transistor and one resistor. Thus, this circuit is simple in structure, is suitable for the integrated circuit, and is ready to realize. Also, the CMOS inverter circuit having the operating speed compensation function can be easily built up.

Since the MOS transistor circuit of the present invention is utilized as the clock repeater in the clock buffer or the clock tree, the clock synchronization that is always precise without the influence of the layout position on the semiconductor chip and the local variation of the substrate temperature can be realized. Also, the operating speed of the MOS transistor can be stabilized irrespective of the fluctuation of the power supply voltage and the variation of the ambient temperature, the variation of the amount of delay in the MOS transistor can be suppressed, and a possibility of a malfunction of the digital circuit can be eliminated.

The MOS transistor circuit of the present invention can adjust appropriately the substrate bias (back gate bias) of the MOS transistor by changing a magnitude of current flowing through the resistor element in response to a level of voltage drop of the power supply line, and then generating the forward bias in response to a level of voltage drop. As a result, the MOS transistor circuit of the present invention can have such an effect that the change of the operating speed of the MOS transistor caused by the drop of the power supply voltage can be compensated automatically (i.e., without adjustment), and is suitable for the CMOS circuit such as the CMOS inverter, or the like.

What is claimed is:

1. A MOS transistor circuit used in a semiconductor integrated circuit, comprising:
   a first MOS semiconductor element of a first conductivity type;
   a substrate bias circuit comprised of a resistor element and a second MOS semiconductor element of a second conductivity type;
   wherein a source of the first MOS semiconductor element is connected to a first source of a first voltage, an input signal is input to a gate of the first MOS semiconductor element;
   the resistor element is connected between the first source and a common connection point between a substrate of the first MOS semiconductor element and a drain of the second MOS semiconductor element;
   a gate of the second MOS semiconductor element is connected to a first source of a second voltage;
   a source of the second MOS semiconductor element is connected to a second source of the second voltage; and
   a level fluctuation of the second source of the second voltage is smaller than that of the first source of the second voltage.

* * * * *